(12) United States Patent
Wei et al.

(10) Patent No.: US 10,764,992 B1
(45) Date of Patent: Sep. 1, 2020

(54) CIRCUIT BOARD AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Yong-Chao Wei, Qinhuangdao (CN); Lin-Jie Gao, Shenzhen (CN); Han-Pei Huang, Hsinchu (TW)

(73) Assignees: Avary Holding (Shenzhen) Co., Limited, Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 16/522,829

(22) Filed: Jul. 26, 2019

(30) Foreign Application Priority Data

Jun. 28, 2019  (CN) .......................... 2019 1 0578256

(51) Int. Cl.
*H05K 1/02* (2006.01)
*H05K 3/46* (2006.01)
*H05K 3/02* (2006.01)

(52) U.S. Cl.
CPC ......... *H05K 1/0216* (2013.01); *H05K 1/0298* (2013.01); *H05K 3/02* (2013.01); *H05K 3/46* (2013.01); *Y10T 29/4913* (2015.01)

(58) Field of Classification Search
CPC ...... H05K 1/0216; H05K 1/0298; H05K 3/02; H05K 3/46; Y10T 29/4913; Y10T 29/49124; Y10T 29/49117; Y10T 29/49002
USPC ................................ 29/832, 829, 825, 592.1
See application file for complete search history.

(56) References Cited

U.S. PATENT DOCUMENTS 9,826,630 B2 * 11/2017 Vincent ................ H05K 3/0073
2016/0270213 A1 * 9/2016 Salehi .................... H05K 3/284

* cited by examiner

*Primary Examiner* — Peter Dungba Vo
*Assistant Examiner* — Azm A Parvez
(74) *Attorney, Agent, or Firm* — ScienBiziP, P.C.

(57) ABSTRACT

A circuit board with anti-EMI proofing for each component on the board includes a first outer wiring layer, electronic components mounted on the first outer wiring layer, and at least one electromagnetic shielding unit. Each electromagnetic shielding unit has a shielding layer and conductive posts formed on the shielding layer, the shielding layer and conductive posts defining a receiving space to house and shield one electronic component. An adhesive layer formed on the first outer wiring layer bonds each electromagnetic shielding unit to the first outer wiring layer.

9 Claims, 12 Drawing Sheets

CIRCUIT BOARD AND METHOD FOR MANUFACTURING THE SAME

FIELD

The subject matter herein generally relates to a circuit board and a method for manufacturing the circuit board.

BACKGROUND

A circuit board may have an electromagnetic shielding layer to reduce electromagnetic interference (EMI) in the circuit board. The sidewall of the EMI layer may include a number of mounting legs. The side wall of the circuit board needs to define a number of receiving grooves for the mounting legs. The mounting legs are inserted into the receiving grooves to connect the electromagnetic shielding layer to the circuit board. However, the mounting legs and the receiving grooves increase the cost and the complexity of manufacturing process. Improvement in the art is desired.

BRIEF DESCRIPTION OF THE DRAWINGS

Implementations of the present technology will now be described, by way of embodiment, with reference to the attached figures.

DETAILED DESCRIPTION

Figure 1:
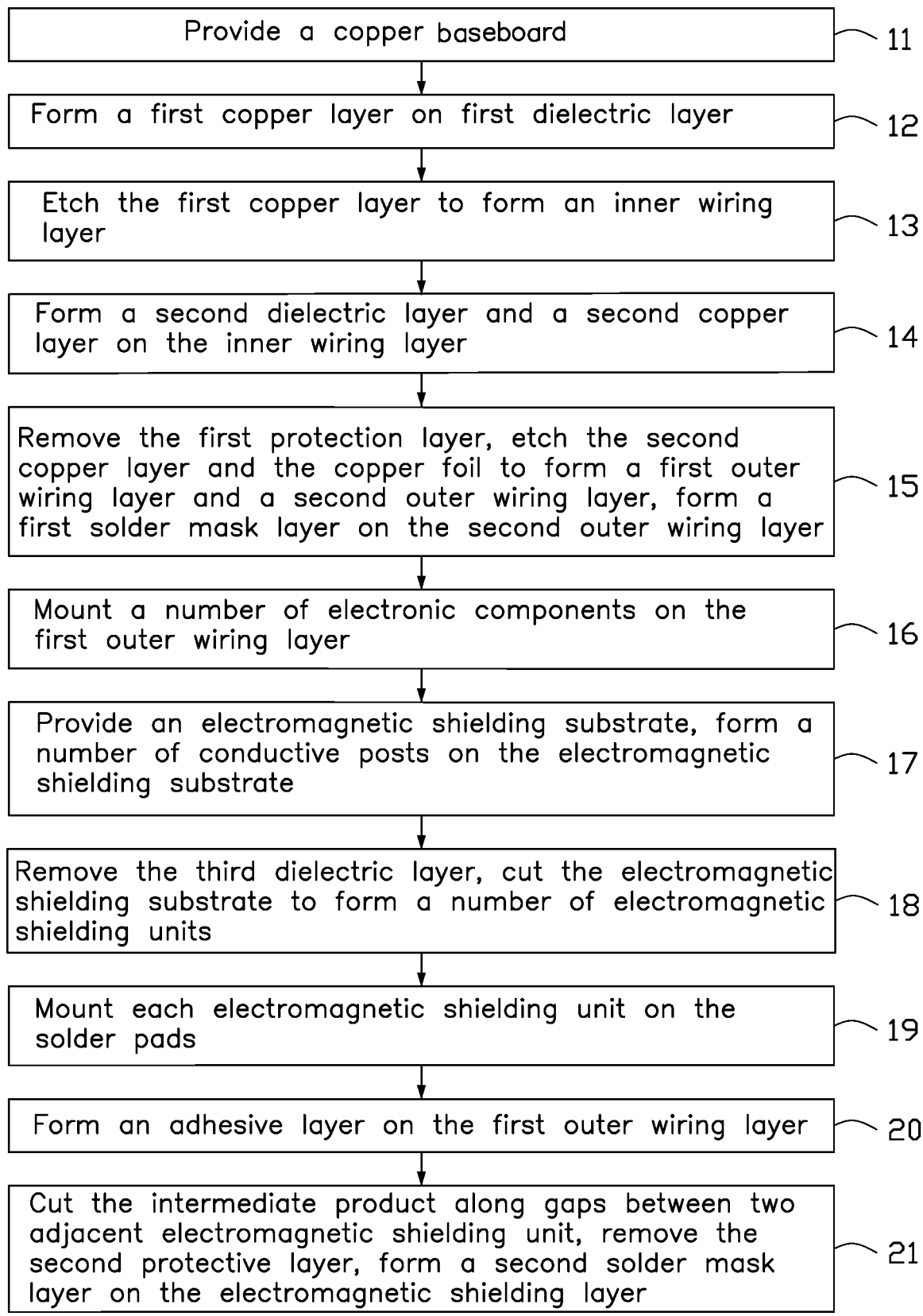
FIG. 1 is a flowchart of an embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a method for manufacturing a circuit board 100 (see FIG. 12) is presented in accordance with an embodiment. The method for manufacturing the circuit board 100 is provided by way of example, as there are a variety of ways to carry out the method. The method can begin at block 11.

Figure 2:
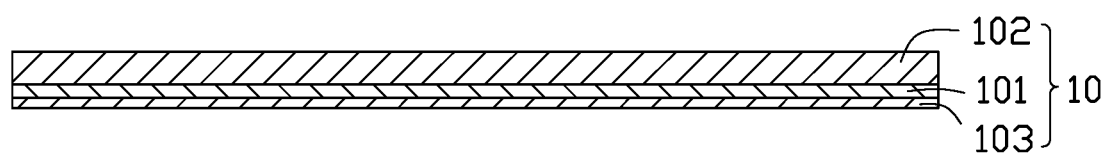
FIG. 2 is a diagrammatic view of a copper substrate used in the method of FIG. 1.

At block 11, referring to FIG. 2, a copper substrate 10 is provided, which includes a first dielectric layer 102, a copper foil 101 formed on the first dielectric layer 102, and a first protection layer 103 formed on the copper foil 101.

The copper substrate 10 is a single-sided copper substrate. However, in other embodiments, the copper substrate 10 can also be a double-sided copper substrate.

The first dielectric layer 102 is made of a dielectric material such as resin or glass. In at least one embodiment, the first dielectric layer 102 is made of a resin selected from a group consisting of polyimide (PI), polyethylene terephthalate (PET), polyethylene naphthalate (PEN), and any combination thereof.

The first protection layer 103 prevents the copper foil 101 from being oxidized.

Figure 3:
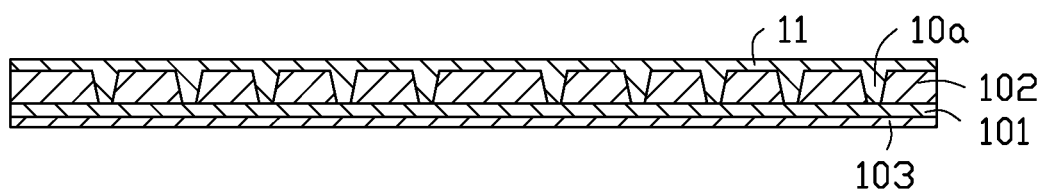
FIG. 3 is a diagrammatic view showing a first copper layer formed on the copper substrate of FIG. 2.

At block 12, referring to FIG. 3, a first copper layer 11 is formed on the first dielectric layer 102.

In at least one embodiment, the first copper layer 11 is formed by electroplating. Before forming the first copper layer 11, at least two blind holes (not labeled) are defined in the first dielectric layer 102. The first copper layer 11 fills in the blind holes to form first conductive vias 10a that electrically connects the first copper layer 11 and the copper foil 101 to each other.

The blind holes can be formed by drilling or laser etching. The blind holes pass through the first dielectric layer 102, and do not pass through the copper foil 101.

In at least one embodiment, after defining the blind holes in the first dielectric layer 102, the blind hole is chemically plated to form a conductive layer (not shown) at the inner wall of the blind hole. The first copper layer 11 fills in the blind hole with the conductive layer.

Figure 4:
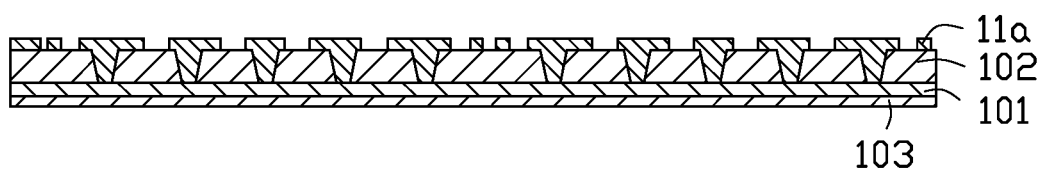
FIG. 4 is a diagrammatic view showing the first copper layer of FIG. 2 etched to form an inner wiring layer.

At block 13, referring to FIG. 4, the first copper layer 11 is etched to form an inner wiring layer 11a.

The inner wiring layer 11a is formed by lithographic exposure and development. In at least one embodiment, a first photosensitive layer (not shown) is formed on the first copper layer 11. The first photosensitive layer is patterned to form hollow patterns through exposure and development. The first copper layer 11 is etched through the patterned first copper layer 11 to form the inner wiring layer 11a. Then, the patterned first copper layer 11 is removed.

Figure 5:
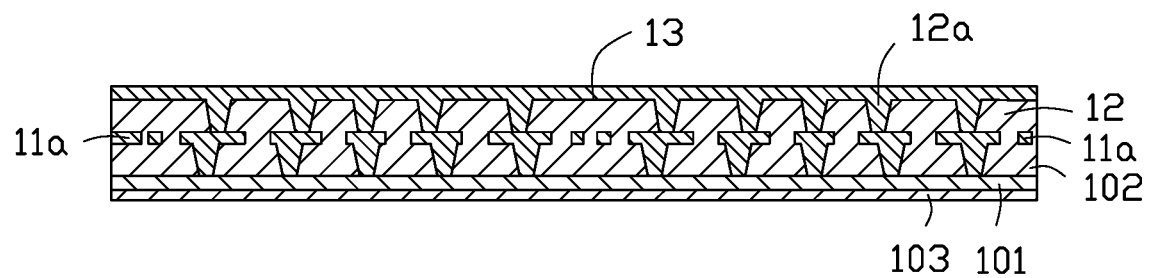
FIG. 5 is a diagrammatic view showing a second copper layer and a second copper layer formed on the inner wiring layer of FIG. 4.

At block 14, referring to FIG. 5, a second dielectric layer 12 and a second copper layer 13 are formed on the inner wiring layer 11a.

In at least one embodiment, before forming the second copper layer 13, at least one blind hole (not labeled) is defined in the second dielectric layer 12. The second copper layer 13 further fills in the blind hole to form at least two second conductive vias 12a that electrically connects the second copper layer 13 to the inner wiring layer 11a. A distance between two adjacent second conductive vias 12a can be more than a distance between two adjacent first conductive vias 10a.

In at least one embodiment, the second dielectric layer 12 is made of polypropylene.

Figure 6A:
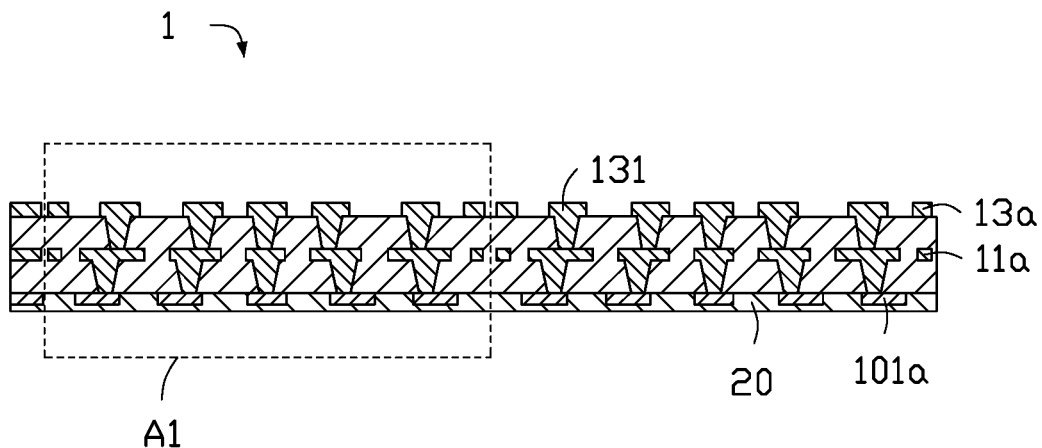
FIG. 6A is a diagrammatic view showing the second copper layer and the copper foil of FIG. 5 etched to form a first outer wiring layer and a second outer wiring layer.
Figure 6B:
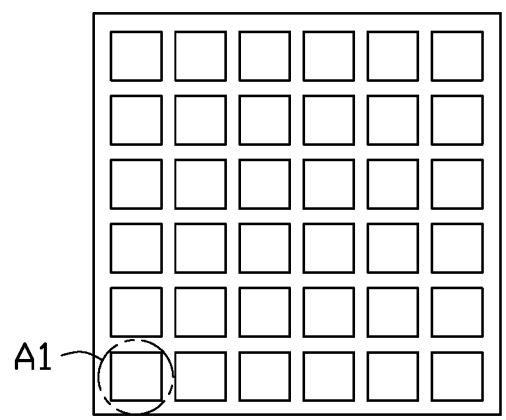
FIG. 6B is a plan view of FIG. 6A.

At block 15, referring to FIGS. 6A and 6B, the first protection layer 103 is removed. The second copper layer 13 and the copper foil 101 are etched to form a first outer wiring layer 13a and a second outer wiring layer 101a respectively. A first solder mask layer 20 is formed on the second outer wiring layer 101a, thereby obtaining a circuit baseboard 1.

The circuit baseboard 1 includes a number of circuit units A1 spaced apart from each other and arranged in a matrix.

Figure 7:
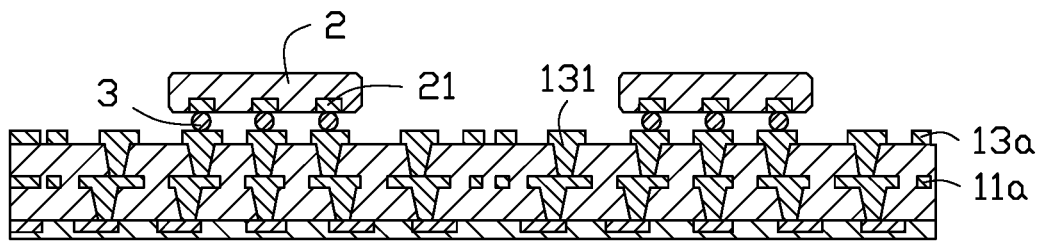
FIG. 7 is a diagrammatic view showing electronic components mounted on the first outer wiring layer of FIG. 6A.

At block 16, referring to FIG. 7, a number of electronic components 2 are mounted on the first outer wiring layer 13a. The first outer wiring layer 13a includes a number of solder pads 131 that electrically connect to the inner wiring layer 11a through the second conductive vias 12a.

The electronic components 2 can be resistors, capacitors, or others. In at least one embodiment, each electronic component 2 includes at least two electrodes 21. Each electrode 21 is connected to one solder pad 131 through a soldering ball 3. The soldering ball 3 can be made of solder paste, conductive silver paste, or conductive copper paste.

Figure 8:
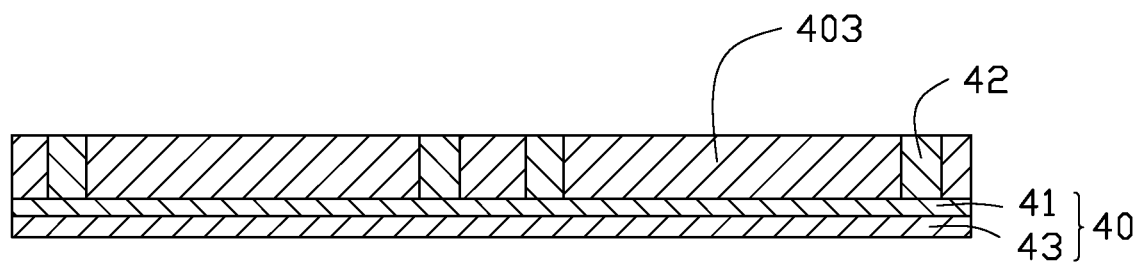
FIG. 8 is a diagrammatic view showing conductive posts formed on an electromagnetic shielding substrate.

At block 17, referring to FIG. 8, an electromagnetic shielding substrate 40 is provided. The electromagnetic shielding substrate 40 includes an electromagnetic shielding layer 41 and a second protective layer 43 formed on the electromagnetic shielding layer 41. A third dielectric layer 403 is formed on a surface of the electromagnetic shielding layer 41 facing away from the second protective layer 43. A number of blind holes are defined in the third dielectric layer 403. Conductive paste or electroplated copper is filled in the blind hole to form a number of conductive posts 42.

In at least one embodiment, the electromagnetic shielding layer 41 is made of steel, aluminum, or copper.

Figure 9A:
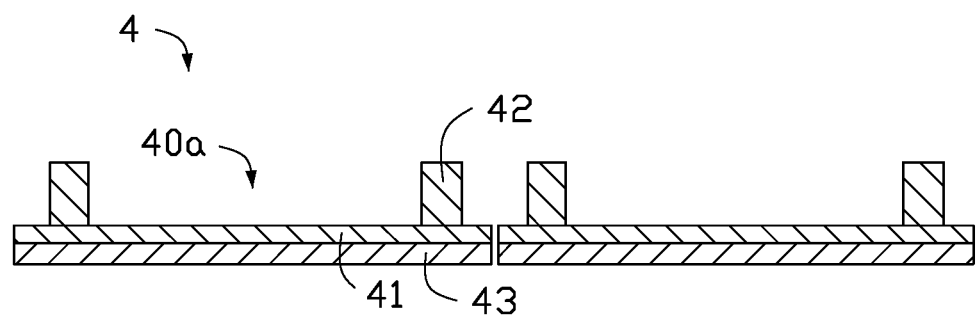
FIG. 9A is a diagrammatic view showing the electromagnetic shielding substrate of FIG. 8 cut to form electromagnetic shielding units.
Figure 9B:
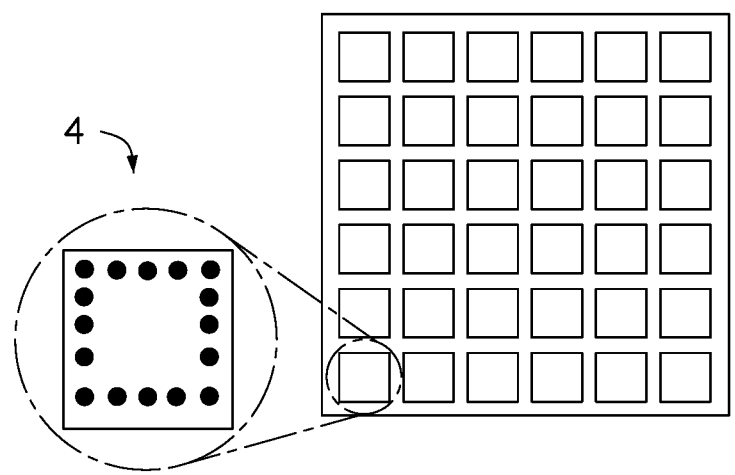
FIG. 9B is a plan view of FIG. 9B.

At block 18, referring to FIGS. 9A and 9B, the third dielectric layer 403 is removed, and the electromagnetic shielding substrate 40 is cut to form a number of electromagnetic shielding units 4.

The electromagnetic shielding units 4 are arranged in a matrix. Each electromagnetic shielding unit 4 includes the electromagnetic shielding layer 41, the second protective layer 43 formed on the electromagnetic shielding layer 41, and at least two conductive posts 42 formed on a surface of the electromagnetic shielding layer 41 facing away from the second protective layer 43. The conductive posts 42 can be adjacent to the edges of the electromagnetic shielding layer 41. The electromagnetic shielding layer 41 and the conductive posts 42 cooperatively define a receiving space 40a.

Each conductive post 42 can be in a shape of a regular or elliptical cylinder, or a prism. The conductive posts 42 can be regularly or randomly arranged. The density of the conductive posts 42 may be adjusted according to the wavelengths of electromagnetic waves to be emitted by the electronic components 2. To achieve an optimal shielding effect, the distance between adjacent conductive posts 42 should be smaller than the wavelengths of the anticipated electromagnetic waves.

Figure 10:
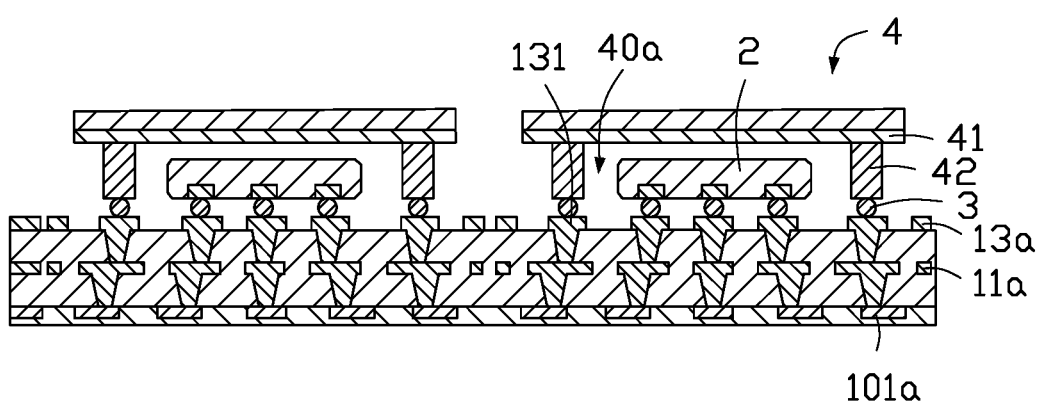
FIG. 10 is a diagrammatic view showing electromagnetic shielding units of FIG. 9A mounted on the solder pads of FIG. 7.

At block 19, referring to FIG. 10, each electromagnetic shielding unit 4 is mounted on the solder pads 131 through the conductive posts 42 and covers one electronic component 2.

Figure 11:
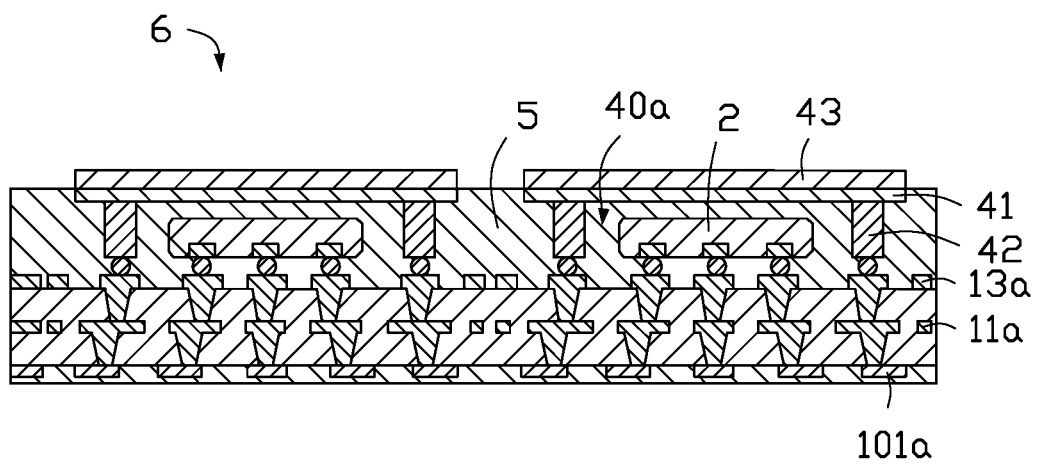
FIG. 11 is a diagrammatic view showing an adhesive layer formed on the first outer wiring layer of FIG. 10.

At block 20, referring to FIG. 11, an adhesive layer 5 is formed on the first outer wiring layer 13a that connects each electromagnetic shielding unit 4 to the first outer wiring layer 13a, thereby forming an intermediate product 6. The adhesive layer 5 fills in the receiving space 40a of each electromagnetic shielding unit 4 (that is, the gaps between each electromagnetic shielding unit 4 and the electronic component 2 that it covers) and the gaps between each two adjacent electromagnetic shielding units 4. The adhesive layer 5 can be flush with the electromagnetic shielding layer 41.

Figure 12:
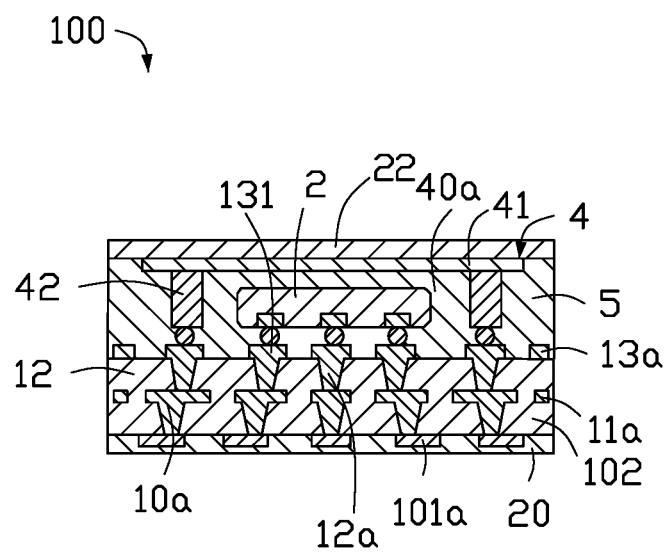
FIG. 12 is a diagrammatic view showing the intermediate product of FIG. 10 cut to form a circuit board.

At block 21, referring to FIG. 12, the intermediate product 6 is cut along gaps between two adjacent electromagnetic shielding units 4. The second protective layer 43 is removed, and a second solder mask layer 22 is formed on the electromagnetic shielding layer 41, thereby forming a number of circuit boards 100. The second solder mask layer 22 can further cover the adhesive layer 5.

In the circuit board, the electronic component generates electromagnetic waves which are reflected or absorbed by the electromagnetic shielding units. The board of the present disclosure has a number of electromagnetic shielding units, and cutting the intermediate product 6 forms a number of circuit boards. Thus, the method can simplify the process and reduce the manufacturing cost. Furthermore, the flexibility for manufacturing the circuit board can be improved. The electromagnetic shielding units are connected to the inner wiring layer through the conductive posts, and the electronic components are received in their own electromagnetic shielding units. The conductive continuity of the electromagnetic shielding units is improved, itself improving the electromagnetic shielding effect. Furthermore, by infilling adhesive between the inner wiring layer and the electromagnetic shielding units and embedding the electronic components in the circuit board, the electromagnetic shielding effect is further enhanced.

Although circuit board of the embodiment includes only three wiring layers, the number of the wiring layers can also be varied according to need.

Referring to FIG. 12, the present disclosure further provides an embodiment of a circuit board 100. The circuit board 100 includes an inner wiring layer 11a, a first dielectric layer 102, and a second dielectric layer 12 formed on opposite surfaces of the inner wiring layer 11a.

The circuit board 100 further includes a first outer wiring layer 13a and a second outer wiring layer 101a respectively formed on the first dielectric layer 102 and the second dielectric layer 12. At least one electronic component 2 is mounted on the first outer wiring layer 13a. The first outer wiring layer 13a includes a number of solder pads 131. A first solder mask layer 20 is formed on the second outer wiring layer 101a.

In at least one embodiment, each electronic component 2 includes at least two electrodes 21. Each electrode 21 is connected to one solder pad 131 through a soldering ball 3. The soldering ball 3 can be made of solder paste, conductive silver paste, or conductive copper paste.

In at least one embodiment, the first dielectric layer 102 defines at least one first conductive via 10a that electrically connects the first outer wiring layer 13a and the inner wiring layer 11a. The second dielectric layer 12 defines at least one second conductive via 12a that electrically connects the second outer wiring layer 101a and the inner wiring layer 11a to each other. A distance between two adjacent second conductive vias 10a can be more than a distance between two adjacent first conductive vias 12a, causing a density of the inner wiring layer 11a to be less than a density of the first outer wiring layer 13a.

The circuit board 100 further includes at least one electromagnetic shielding unit 4. The electromagnetic shielding unit 4 includes the electromagnetic shielding layer 41 and at least two conductive posts 42 formed on the electromagnetic shielding layer 41. The electromagnetic shielding layer 41 and the conductive posts 42 cooperatively define a receiving space 40a. The electromagnetic shielding unit 4 is mounted on the solder pads 131 through the conductive posts 42 and covers one electronic component 2. That is, the electronic component 2 is received in the receiving space 40a. An adhesive layer 5 is formed on the first outer wiring layer 13a that connects each electromagnetic shielding unit 4 to the first outer wiring layer 13a. The adhesive layer 5 fills in the receiving space 40a of each electromagnetic shielding unit 4 (that is, space between each electromagnetic shielding unit 4 and the electronic components 2 it covers). A second solder mask layer 22 is formed on the electromagnetic shielding layer 41. The second solder mask layer 22 can further cover the adhesive layer 5.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
   providing a circuit baseboard comprising a first outer wiring layer;
   mounting at least two electronic components mounted on the first outer wiring layer;
   providing at least two electromagnetic shielding units, each of the two electromagnetic shielding units comprising an electromagnetic shielding layer and at least two conductive posts formed on the electromagnetic shielding layer, the conductive posts and the electromagnetic shielding layer cooperatively defining a receiving space, wherein providing the at least two electromagnetic shielding units comprises:
      providing an electromagnetic shielding substrate comprising the electromagnetic shielding layer and a second protective layer formed on the electromagnetic shielding layer;
      forming a third dielectric layer on a surface of the electromagnetic shielding layer facing away from the second protective layer;
      defining at least two blind holes in the third dielectric layer;
      forming one of the conductive posts in each of the two blind holes;
      removing the third dielectric layer; and
      cutting the electromagnetic shielding substrate to form the electromagnetic shielding units;
   mounting each of the two electromagnetic shielding units on the first outer wiring layer, causing each of the electronic components to be received in the receiving space of a corresponding one of the two electromagnetic shielding units;
   forming an adhesive layer on the first outer wiring layer which connect each of the two electromagnetic shielding units to the first outer wiring layer, thereby forming an intermediate product; and
   cutting the intermediate product to form at least two circuit boards.

2. The method of claim 1, wherein the electromagnetic shielding units in the intermediate product are spaced apart from each other, and the intermediate product is cut along gaps between two adjacent electromagnetic shielding units to form the circuit boards.

3. The method of claim 1, wherein the first outer wiring layer comprises a plurality of solder pads, and the electromagnetic shielding units are mounted on the solder pads through the conductive posts.

4. The method of claim 1, wherein providing the circuit baseboard comprises:
   providing a copper substrate comprising a first dielectric layer, a copper foil formed on the first dielectric layer, and a first protection layer formed on the copper foil;
   forming a first copper layer on the first dielectric layer;
   etching the first copper layer to form an inner wiring layer;
   forming a second dielectric layer and a second copper layer on the inner wiring layer;
   removing the first protection layer; and
   etching the second copper layer to form the first outer wiring layer.

5. The method of claim 4, further comprising:
   etching the copper foil to form a second outer wiring layer; and
   forming a first solder mask layer on the second outer wiring layer, thereby obtaining the circuit baseboard.

6. The method of claim 5, further comprising:
   forming at least two first conductive vias in the first dielectric layer, which electrically connects the first copper layer and the copper foil to each other.

7. The method of claim 6, further comprising:
   forming at least two second conductive vias in the second dielectric layer, which electrically connects the second copper layer and the inner wiring layer to each other.

8. The method of claim 7, wherein a distance between two adjacent second conductive vias is more than a distance between two adjacent first conductive vias, and a density of the inner wiring layer distributed on the first dielectric layer is less than a density of the first outer wiring layer distributed on the second dielectric layer.

9. The method of claim 1, further comprising:
   forming a second solder mask layer on the electromagnetic shielding layer.

* * * * *